(12) United States Patent
Shen et al.

(10) Patent No.: US 7,975,203 B2
(45) Date of Patent: Jul. 5, 2011

(54) QUADRATIC POLYNOMIAL PERMUTATION (QPP) INTERLEAVER PROVIDING HARDWARE SAVINGS AND FLEXIBLE GRANULARITY ADAPTABLE TO ANY POSSIBLE TURBO CODE BLOCK SIZE

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1062 days.

(21) Appl. No.: 11/810,890

(22) Filed: Jun. 7, 2007

(65) Prior Publication Data

US 2008/0172590 A1 Jul. 17, 2008

Related U.S. Application Data

(60) Provisional application No. 60/880,835, filed on Jan. 17, 2007, provisional application No. 60/897,653, filed on Jan. 26, 2007.

(51) Int. Cl.
*H03M 13/00* (2006.01)
(52) U.S. Cl. ........................................ 714/755; 714/702
(58) Field of Classification Search .................. 714/702, 714/755
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,553,516 B1 * | 4/2003 | Suda et al. | 714/702 |
| 2008/0115034 A1 * | 5/2008 | Cheng | 714/755 |

FOREIGN PATENT DOCUMENTS

| | | |
|---|---|---|
| CN | 1288292 A | 3/2001 |
| EP | 0 735 696 A2 | 10/1996 |

(Continued)

OTHER PUBLICATIONS

C. Berrou, Y. Saouter, C. Douillard, S. Kerouédan, and M. Jézéquel, "Designing good permutations for turbo codes: towards a single model," 2004 IEEE International Conference on Communications (ICC), vol. 1, pp. 341-345, Jun. 20-24, 2004.

(Continued)

*Primary Examiner* — Sam Rizk
(74) *Attorney, Agent, or Firm* — Garlick Harrison & Markison; Shayne X. Short

(57) ABSTRACT

Quadratic polynomial permutation (QPP) interleaver providing hardware saving and flexible granularity adaptable to any possible turbo code block size. A means is presented by which only a very small number of coefficients need be stored to effectuate a wide variety of QPP interleaves as can be employed in the context of turbo coding. In one instance, to accommodate the approximate 6000 different turbo code block sizes in 3GPP LTE channel coding, only 5 different coefficient values need to be stored to effectuate a very broad range of QPP interleaves to be applied each of those various turbo code block sizes. Moreover, a few small number of dummy bits, if any, need to be employed to accommodate a very broad range of turbo code block sizes. It is noted that the QPP interleaving as described herein can be applied to turbo encoding and turbo decoding (e.g., including both interleaving and de-interleaving).

20 Claims, 13 Drawing Sheets

FOREIGN PATENT DOCUMENTS

| | | | |
|---|---|---|---|
| EP | 0 735 696 | A3 | 1/1999 |
| FR | 91 05278 | A1 | 10/1992 |

OTHER PUBLICATIONS

O. Y. Takeshita, "On maximum contention-free interleavers and permutation polynomials over integer rings," IEEE Trans. Information Theory, vol. 52, No. 3, Mar. 2006, pp. 1249-1253 (5 pages).

Ericsson, Motorola, "QPP interleaver parameters," 3GPP TSG RAN WG1 #47bis R1-070484 (5 pages).

A. Tarable, S. Benedetto and G. Montorsi "Mapping Interleaving Laws to Parallel Turbo and LDPC Decoder Architectures," IEEE Trans. on Information Theory, vol. 50, No. 9, pp. 2002-2009. Sep. 2004 (8 pages).

\* cited by examiner

QUADRATIC POLYNOMIAL PERMUTATION (QPP) INTERLEAVER PROVIDING HARDWARE SAVINGS AND FLEXIBLE GRANULARITY ADAPTABLE TO ANY POSSIBLE TURBO CODE BLOCK SIZE

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Applications which are hereby incorporated herein by reference in their entirety and made part of the present U.S. Utility patent application for all purposes:

1. U.S. Provisional Application Ser. No. 60/880,835, entitled "Formulaic flexible collision-free memory accessing for parallel turbo decoding with quadratic polynomial permutation (QPP) interleave," filed Jan. 17, 2007, pending.

2. U.S. Provisional Application Ser. No. 60/897,653, entitled "Quadratic polynomial permutation (QPP) interleaver providing hardware savings and flexible granularity adaptable to any possible turbo code block size," pending.

Incorporation by Reference

The following U.S. Utility Patent Application is hereby incorporated herein by reference in its entirety and made part of the present U.S. Utility Patent Application for all purposes:

1. U.S. Utility Application Ser. No. 11/810,991, entitled "Formulaic flexible collision-free memory accessing for parallel turbo decoding with quadratic polynomial permutation (QPP) interleave," filed concurrently on Jun. 7, 2007, pending.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Many communication systems incorporate the use of a turbo code. While there are many potential applications that can employ turbo codes, means are presented herein that can be applied to the 3GPP channel code to support an arbitrary number of information bits. Some examples of the number of bits, though not limited thereto, that can be supported using the various aspects of the invention presented herein are 40 to 5114 for WCDMA and HSDPA and more for LTE. Alternatively, other examples of the number of bits, though not limited thereto, that can be supported using the various aspects of the invention presented herein are 40 to 6114 or 40 to 8192, or any other desirable number of bits as selected for a particular application.

Additional information regarding the UTRA-UTRAN Long Term Evolution (LTE) and 3GPP System Architecture Evolution (SAE) can be found at the following Internet web site:

www.3gpp.org

Turbo coding was suggested for 3GPP LTE channel coding. Within the channel coding system in 3GPP LTE, there is a need and desire to supply and provide for a wide range of block sizes (i.e., turbo code block lengths). For this coding system, the algebraic interleave referred to as the "almost regular permutation (ARP)" in reference [1] is considered as one of the candidates, and "quadratic polynomial permutation (QPP)" in reference [2] is considered as an alternative candidate.

Furthermore, the turbo decoding of this system generally needs to be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time).

In reference [3], 188 different set of coefficients are proposed to support about 6,000 different block sizes. Using the list in reference [3], in the worst case 128 dummy bits need to be added for marching the nearest QPP interleave according to the approach presented therein.

In accordance with certain aspects of the invention, a much smaller QPP coefficients list can be employed which also provides significantly more flexible granularity that the approach in reference [3]. This allows for much fewer dummy bits, if any, that need to be employed to effectuate all of a large number of required interleaves (π) to support a wide variety of turbo codes.

Figure 1:
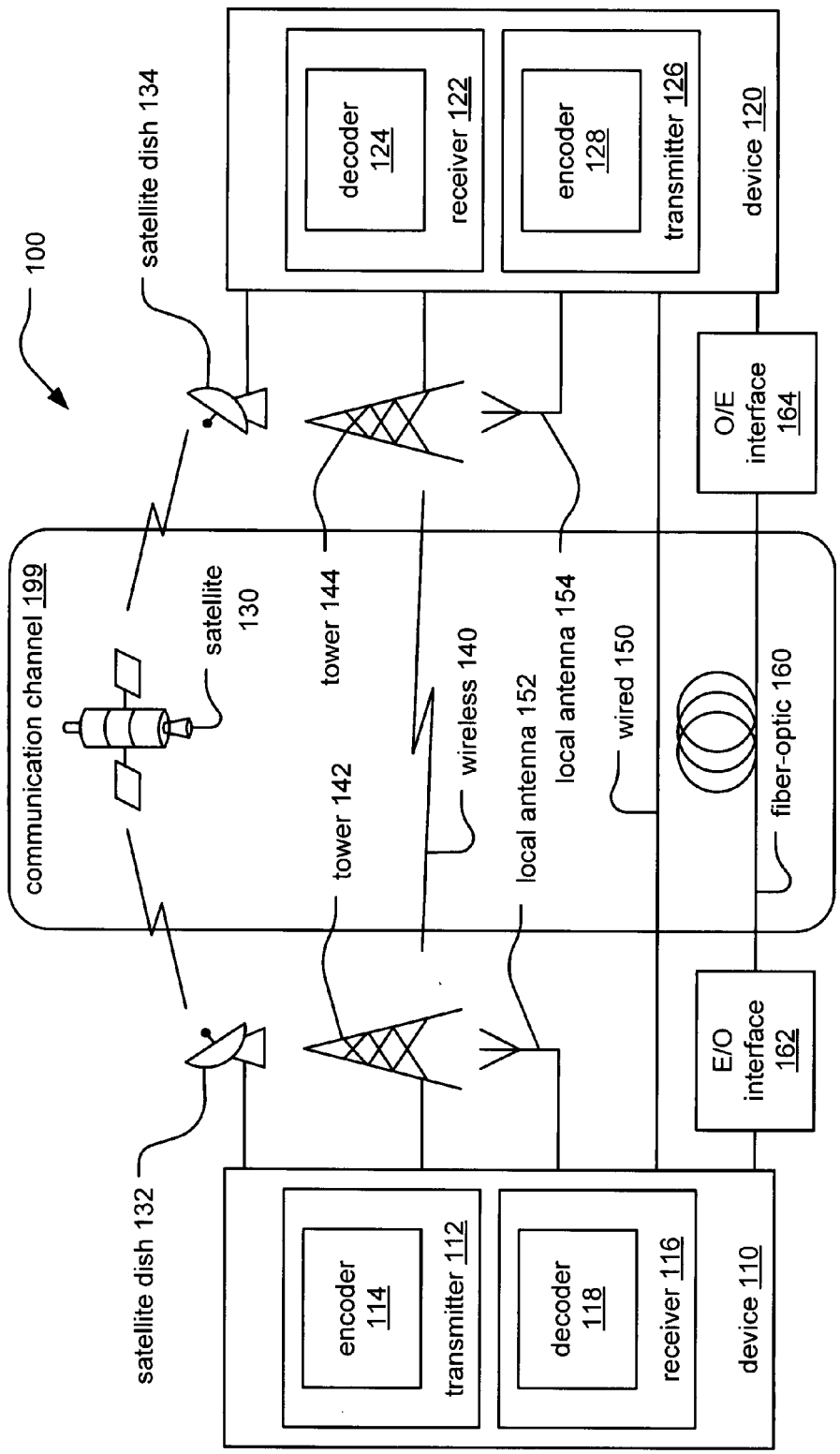
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Figure 2:
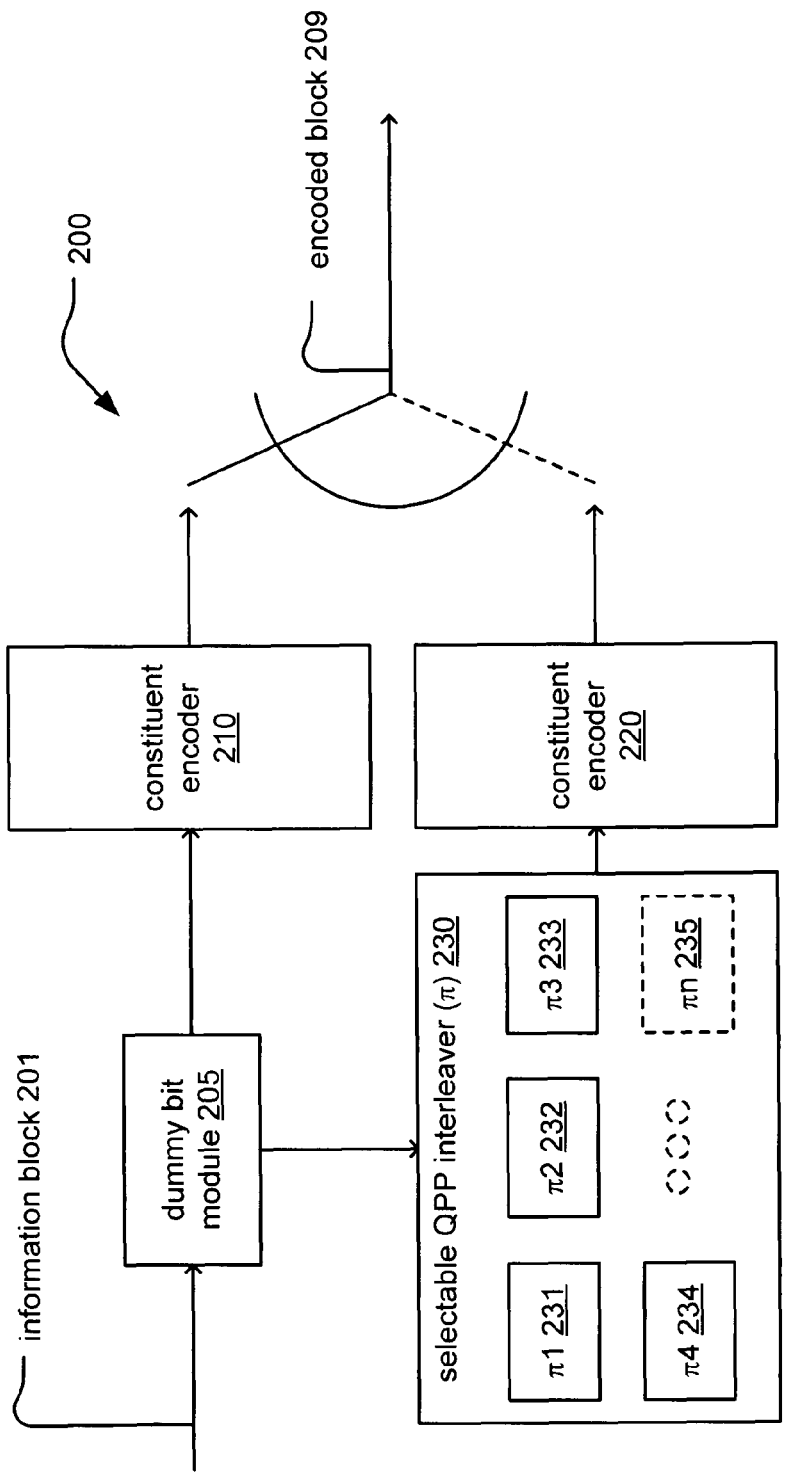
FIG. 2 illustrates an embodiment of a turbo encoder employing selectable interleaving.

FIG. 2 illustrates an embodiment of a turbo encoder 200 employing selectable interleaving. An information block 201, which includes at least one information bit, is provided to a dummy bit module 205. The dummy bit module 205 is operable to add a small number of dummy bits to the information block 201 based on a size of the information block 201. There are many embodiments that require no adding of any dummy bits whatsoever to the information block 201. The information block 201, which is then output from the dummy bit module 205 after any dummy bits have been selectively added thereto, is simultaneously provided to a top path and a bottom path. The top path includes a first constituent encoder 210, and the bottom path includes a selectable quadratic polynomial permutation (QPP) interleaver (π) 230 communicatively coupled to a second constituent encoder 220. A variety of interleaves may be performed as selected for the particular application within the selectable interleaver (π) 230. The selectable QPP interleaver (π) 230 can perform any number of QPP interleaves, as shown by a first interleave (π1) 231, a second interleave (π2) 232, a third interleave (π3) 233, a fourth interleave (π4) 234, and up to an nth interleave (πn) 239. The outputs from the top and bottom paths are alternatively selected to form an encoded block 299.

Within certain embodiments of the invention, a very limited list of coefficients need to be stored for the selectable interleaver (π) 230 to be operable to perform a very wide variety of different QPP interleaves that may be employed when using any desired turbo code block size.

Also, it is noted that the dummy bit modules described above, as well as any module, processing module, processing block, or other functional block described herein may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Such a module, processing module, processing block, or other functional block described herein can be coupled to a memory. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to at least some of the steps and/or functions illustrated herein.

Quadratic Polynomial Permutation (QPP)

Additional details regarding the quadratic polynomial permutation (QPP) interleave ($\pi$) are presented below.

Let a turbo code block size, or an interleave size of the turbo code be L, then if the following function $$\pi(x) = f_1 x + f_2 x^2 \mod(L) \quad \text{(EQ 1)}$$

where $f_1$ and $f_2$ are non-negative integers, is said to be a QPP over the ring permutation on $Z_L = \{0, 1, \ldots, L-1\}$, when f(x) permutes $\{0, 1, \ldots, L-1\}$. This is referred to as a quadratic polynomial as described in reference [2].

Denote the set of prime numbers by $P = \{2, 3, \ldots\}$. Denote $L = \Pi_{p \in P} p^{n_{L,p}}$. Then a necessary and sufficient condition [1] for f(x) to be QPP is 1) when $n_{L,2} \neq 1$, $\gcd(f_1, L) = 1$ and $$f_2 = \prod_{p \in P} p^{n_{f_2,p}}$$

such that $n_{f_2,p} \geq 1$ if $n_{L,p} \geq 1$;

2) when $n_{L,2} = 1$, $f_1 + f_2$ is odd, $\gcd(f_1, N/2) = 1$ and $$f_2 = \prod_{p \in P} p^{n_{f_2,p}}$$

such that $p \neq 2$ and $n_{f_1,p} \geq 1$ if $n_{L,p} \geq 1$.

Reduced Hardware and Flexible Granularity Quadratic Polynomial Permutation (QPP)

Herein, a novel approach of generating a wide variety of QPP interleaves ($\pi$) is presented using a very minimal number of coefficients and thereby also requiring only a very minimal amount of memory. Also, a significant degree of granularity is provided so that very few dummy bits, if any, need to be employed to accommodate any of a wide variety of interleaves ($\pi$) as may be employed to accommodate a wide variety of turbo code block size.

The means presented herein allows for a set of K QPP interleaves ($\pi$) for any possible turbo code block size. In one embodiment, presented herein allows for a set of K QPP interleaves ($\pi$) for any possible turbo code block size ranging from 40 to 6144 or ranging from 40 to 8192.

In accordance with this approach, the first QPP coefficient, $f_1$, is chosen to be a fixed prime such that for all possible interleave size L (i.e., turbo code block size L), so that the first QPP coefficient, $f_1$, satisfies the necessary and sufficient condition listed above.

Now, the approach involves choosing a set of K numbers $I_1 \leq I_2 \leq \ldots \leq I_k$ such that $I_j$ is a multiple of some number x. It is noted that K is the number of sub-ranges within the entire range of turbo code blocks sizes to be accommodated. In some embodiments, K=4 or K=8. The number, x, is selected such that the interleave size L is divisible by this number, x, and also that the necessary and sufficient condition described above with respect to the QPP interleave ($\pi$) holds.

The number, x, also determines the particular granularity of the embodiment (e.g., assists in determining the number of dummy bits which may need to be added) to accommodate all possible turbo code block sizes within the desired entire range. This number, x, is selected in a desire to cover all of a number of required interleaves for a given application (e.g., all 6,000 interleaves of the 3GPP LTE emerging standard in one case), while also ensuring that few, if any, dummy bits need be required to accommodate all of the possible turbo code block sizes.

Looking at one embodiment which provides one possible degree of granularity, and would require at most 3 dummy bits to be added, let the interleave size L always be the multiple of x=4 or that the interleave size L is divisible by x=4, i.e., this can be referred to as "case 1"); this will satisfy the necessary and sufficient condition described above with respect to the QPP interleave ($\pi$).

Considering the example where K=4, and also taking $I_1=4$, $I_2=8$, $I_3=8$, $I_4=12$.

Now choose K regions $R_1, R_2, \ldots, R_{K-1}, R_K$ such that $$R_j = \{i | i = 0 \mod I_j, B_{j-1} \leq i < B_j\} \text{ (e.g., i is a multiple of } I_j),$$

where $B_0 < B_1 < \ldots < B_K$ with lower bound, $B_0$, and upper bound, $B_K$ (e.g., $B_0=40$ and $B_K=6145$ (or 8193)).

For every region $R_j$, this approach involves finding the smallest subset of prime numbers $P_j$ such that for any block size $L \in R_j$, we have $$L = I_j \prod_{p \in P_j} p^{n_{s,p}}.$$

Define $$f_{2,j} = \prod_{p \in P_j} p^{n_{f_2,j,p}}$$

with $n_{f_{2,j},p} \geq 1$. Now we have K polynomials $$F_j(x) = f_1 x + f_{2,j} x^2, j=1, 2, \ldots, K$$

Moreover, for any block size $L \in R_j$, $$f_j(x) = f_1 x + f_2 x^2 \mod L$$

is a QPP of size L guaranteed by the necessary and sufficient condition.

EXAMPLE 1

Let K=4, $I_1=4, I_2=8, I_3=8, I_4=12$
and $B_1=501, B_2=2,001, B_3=4,001, B_4=6145$. We can take $f_1=1021$.

This will therefore require storing only 5 separate coefficients to effectuate all of the desired possible interleaves to accommodate any possible turbo code block size within this range (i.e., $f_1=1021$ and 4 other coefficients of $f_{2,1}, f_{2,2}, f_{2,3}, f_{2,4}$).

As can be seen, this novel QPP interleave system offers a significant hardware savings when compared to previous approaches. For example, a very limited number of coefficients need to be stored (i.e., one first QPP coefficient, $f_1$, and only K second QPP coefficients in accordance with K·$f_2$).

This novel QPP interleave system also offers a high degree of flexible granularity, in that, as long as the desired turbo code block size, L, is within one of the sub-regions for which there is a QPP of that size (i.e., the desired turbo code block size, L, is actually within one of the sub-ranges in which the entire range has been partitioned), then the maximal dummy bits need to be added is $I_K-1$. For example, if a designer makes the selection of the value K=4 and $I_1$=4, $I_2$=8, $I_3$=8, $I_4$=12, then at most 11 dummy bits would need to be added to accommodate any possible turbo code block size. Alternatively, if a designer selected an increment of only 4, then at most 3 dummy bits would be required.

Figure 3:
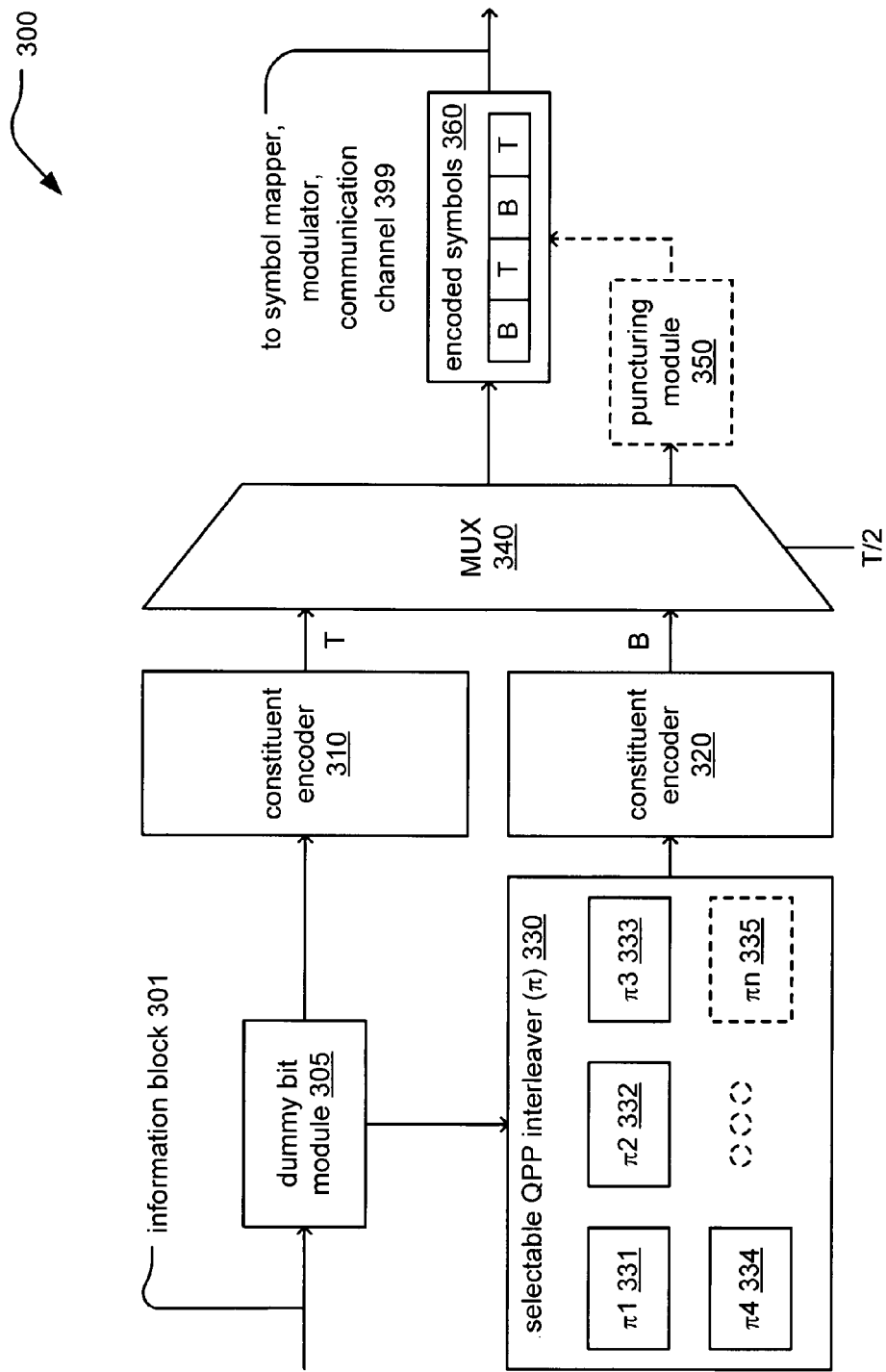
FIG. 3 illustrates another embodiment of a turbo encoder employing selectable interleaving.

FIG. 3 illustrates another embodiment of a turbo encoder 300 employing selectable interleaving. This embodiment is somewhat analogous to the previous embodiment. An information block 301, which includes at least one information bit, is provided to a dummy bit module 305. The dummy bit module 305 is operable to add a small number of dummy bits to the information block 301 based on a size of the information block 301. There are many embodiments that require no adding of any dummy bits whatsoever to the information block 301. The information block 301, which is then output from the dummy bit module 305 after any dummy bits have been selectively added thereto, is simultaneously provided to a top path and a bottom path. The top path includes a first constituent encoder 310, and the bottom path includes a selectable quadratic polynomial permutation (QPP) interleaver (π) 330 communicatively coupled to a second constituent encoder 320. A variety of interleaves may be performed as selected for the particular application within the selectable interleaver (π) 330. The selectable QPP interleaver (π) 330 can include any number of interleaves, as shown by a first interleave (π1) 331, a second interleave (π2) 332, a third interleave (π3) 333, a fourth interleave (π4) 334, and up to an nth interleave (πn) 339. In some embodiments, only 4 interleaves are employed.

The outputs from the top (shown as T) and bottom (shown as B) paths are provided to a multiplexor (MUX) 340, whose selection is provided by a clock signal that is clocked at ½ the rate at which the input bits of the information block 301 are provided to the top and bottom paths. This way, the output of the MUX 340 alternatively selects the outputs from the top (shown as T) and bottom (shown as B) paths.

In some embodiment, these output encoded bits are then provided to a puncturing module 350. In certain embodiments, no puncturing is performed on the bits output from the MUX 340; they are all simply passed as output from the MUX 340. However, in other embodiments, puncturing is selectively performed to effectuate any number of criteria, including accommodating a particular code rate, a particular modulation type, among other considerations. A variety of encoded symbols 360 may then be then generated according to the outputs from the top and bottom paths; the bottom path being an interleaved path (i.e., as performed by one of the interleaves of the selectable QPP interleaver (π) 330). It is noted that the selectable QPP interleaver (π) 330 can also be implemented to change its operation as a function of time; for example, the selectable QPP interleaver (π) 330 can employ the first interleave (π1) 331 during a first time or when encoding a first information block, and the selectable interleaver (π) 330 can employ the second interleave (π2) 332 during a second time, and so on.

These encoded symbols 360 of the encoded block may then be passed to a symbol mapper where the symbols are mapped according to the appropriate modulation (constellation and mapping).

It is noted that the selectable interleaver (π) 330 within the FIG. 2 may be implemented such that it operates to correspond the order of the input bits of the information block 301 with the order in which the encoded symbols 360 are output from this embodiment of turbo encoder. That is to say, the first output, encoded symbol corresponds to the first group of input bits (or first input symbol); the second output, encoded symbol corresponds to the second group of input bits (or second input symbol). Alternatively, the selectable QPP interleaver (π) 330 may be implemented such that corresponding the order of the input bits (or symbols) need not necessarily correspond to the output order of the encoded symbols to the input order of the groups of input bits (or input symbols).

As with the previous embodiment, a very limited list of coefficients need to be stored for the selectable interleaver (π) 330 of this embodiment to be operable to perform a very wide variety of different QPP interleaves that may be employed when using any desired turbo code block size.

Figure 4:
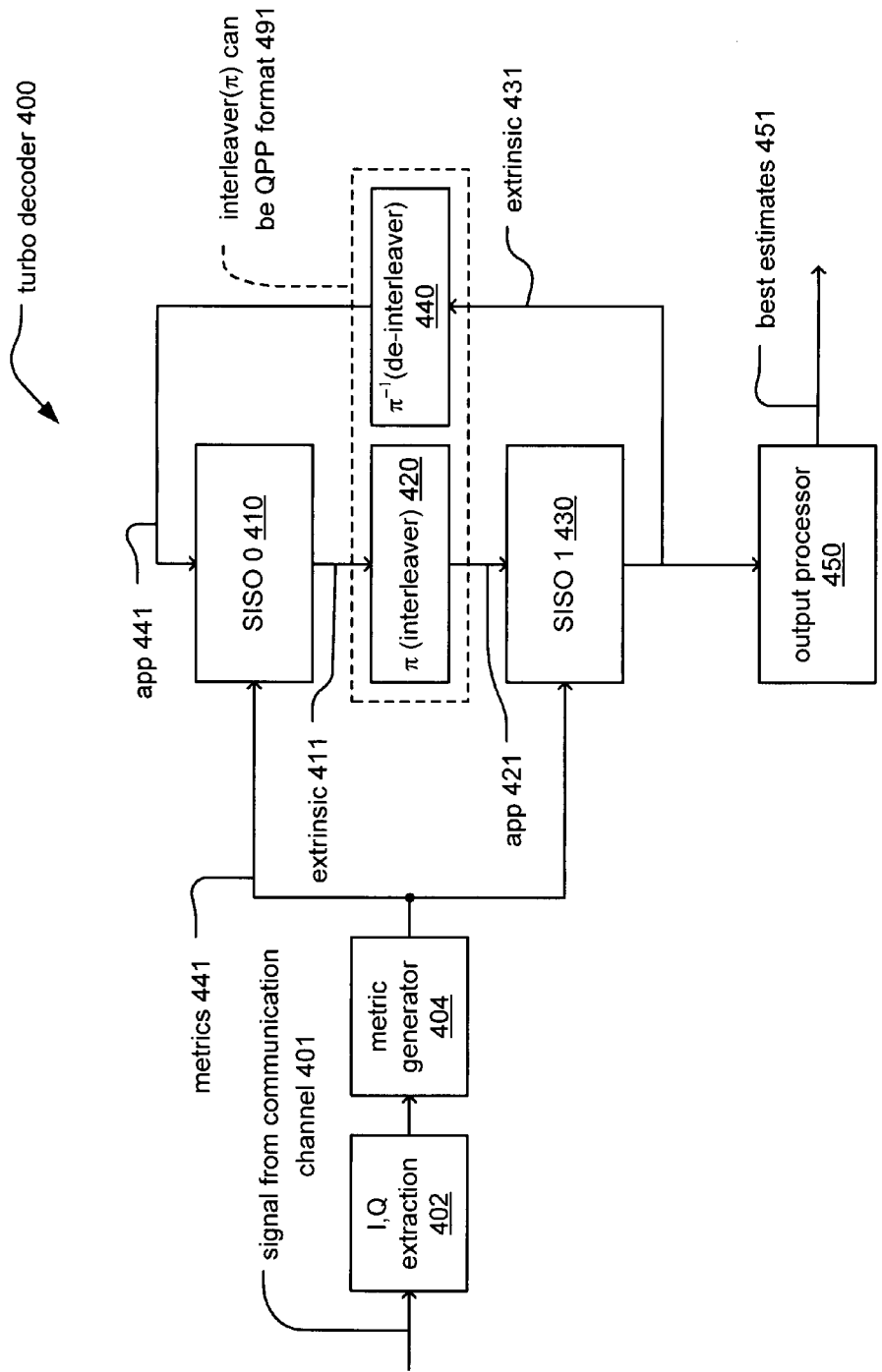
FIG. 4 illustrates an embodiment of a turbo decoder.

FIG. 4 illustrates an embodiment of a turbo decoder 400. A received signal (e.g., typically received from a communication channel) is provided to an I,Q extraction module 402 that extracts the I,Q (in-phase and quadrature) components from the received signal 401. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 404. The metric generator 404 generates the appropriate metrics 441 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 441 that are calculated by the metric generator 404 are then provided simultaneously to a first soft-in/soft-out (SISO 0) decoder 410 and a second SISO 1 decoder 430. In the context of trellis coding (e.g., turbo trellis coded modulation (TTCM)), each of the first SISO 0 decoder 410 and the second SISO 1 decoder 430 calculates forward metrics (alphas) and backward metrics (betas), and extrinsic values according to the trellis employed.

These alphas, betas, and extrinsics are all calculated for each symbol within a frame that is to be decoded. These calculations of alphas, betas, and extrinsics are all based on the trellis.

Starting with the first SISO 0 decoder 410, after the extrinsic values 411 have been calculated, they are passed to an interleaver (π) 420 after which it is passed to the second SISO 1 decoder 430 as "a priori probability" (app) information 421. Similarly, after extrinsic values 431 have been calculated within the second SISO 1 decoder 430, they are passed to a de-interleaver ($\pi^{-1}$) 440 after which it is passed to the first SISO 0 decoder 410 as "a priori probability" (app) information 441. It is noted that a single decoding iteration, within the iterative decoding process of the turbo decoder 400 consists of performing two SISO operations; that is to say, the iterative decoding process must pass through both the first SISO 0 decoder 410 and through the second SISO 1 decoder 430.

After a significant level of confidence has been achieved and a solution is being converged upon, or after a predetermined number of decoding iterations have been performed, then the output from the second SISO 1 decoder 430 is passed as output to an output processor 450. The operation of the SISOs 410 and 430 may generally be referred to as calculating soft symbol decisions of the symbol contained within the received symbol. These soft symbol decisions may be performed on a true bit level in certain embodiments. The output processor 450 uses these soft symbol decisions to generate best estimates 451 (e.g., hard bit and/or symbol decisions) for the information bits that have been encoded within the original turbo coded signal (e.g., generally within a turbo encoder location at another end of a communication channel into which the signal 401 was originally launched.

It is also noted that the interleaving performed within the interleaver ($\pi$) 420 can be performed using an embodiment of a QPP interleave, as shown by reference numeral 491.

Many of the embodiments presented herein employ various embodiments of the quadratic polynomial permutation (QPP) interleave. Even more details are provided below with respect to the means by which to perform QPP interleaving.

Figure 5:
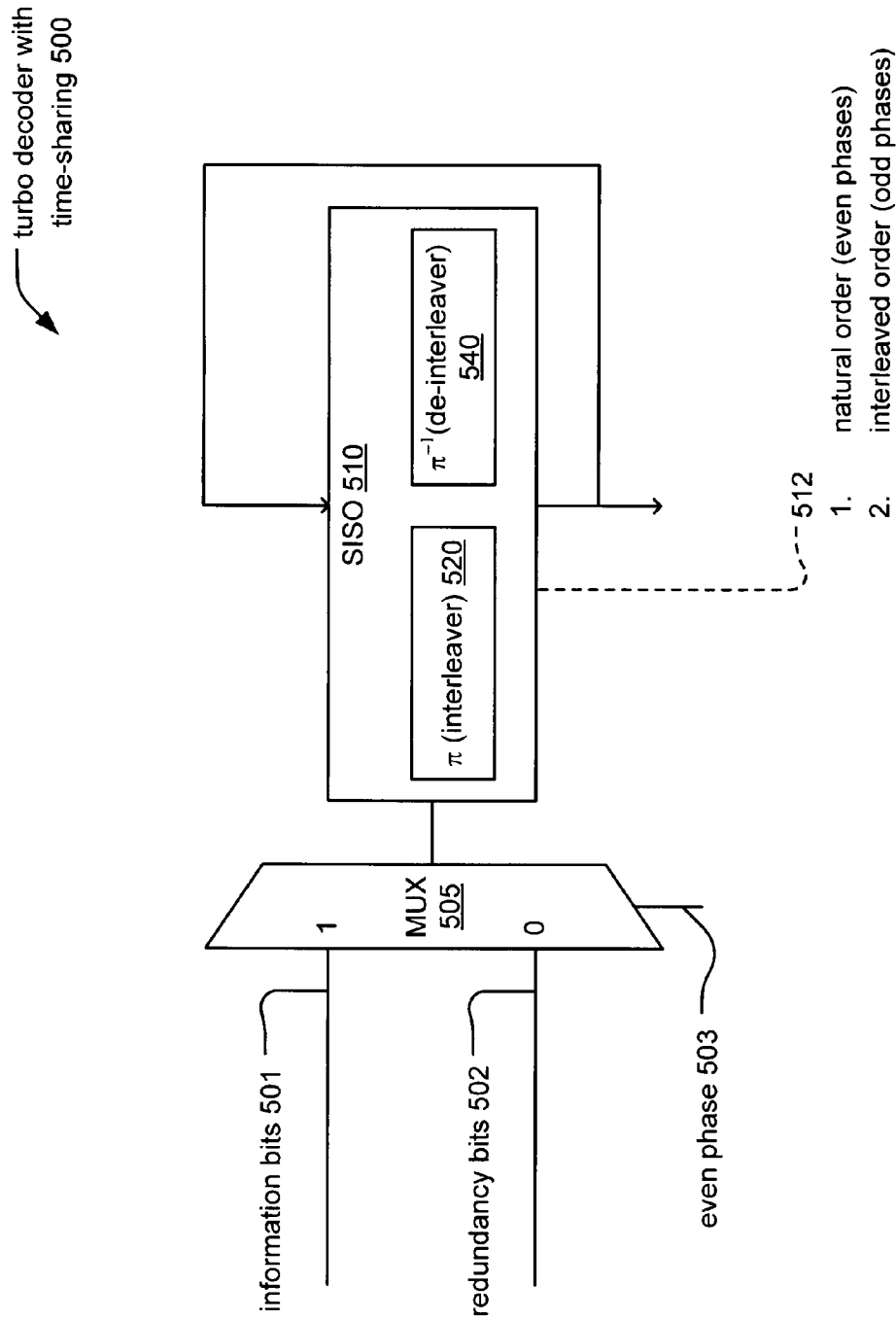
FIG. 5 illustrates an embodiment of a turbo decoder with time-sharing that is operable to employ a single soft-in/soft-out (SISO) decoder or a single array of SISO decoders.

FIG. 5 illustrates an embodiment of a turbo decoder with time-sharing that is operable to employ a single soft-in/soft-out (SISO) decoder or a single array of SISO decoders. This embodiment employs a single SISO decoder or single array of SISO decoders to perform both the SISO 0 and the SISO 1 decoding operations in accordance with turbo decoding processing (or parallel turbo decoding processing). A MUX 505 is operable to receive both information bits 501 and redundancy bits 502 and selectively to provide them to a SISO decoder 510. The SISO decoder 510 of this embodiment also includes an integrated interleaver ($\pi$) 520 and integrated de-interleaver ($\pi^{-1}$) 540. The select signal of the MUX 505 operates according to a signal whose even phase 503 governs the selection of either the information bits 501 or redundancy bits 502 to be provided to the SISO decoder 510 to perform either SISO 0 decoding processing or SISO 1 decoding processing.

In one embodiment, as depicted by reference numeral 512, when performing the natural order phase decoding (e.g., SISO 0 decoding operations), the accessing of memory entries is performed when the select signal 503 indicates an even phase to the MUX 506. Also, when performing the interleaved ($\pi$) order phase decoding (e.g., SISO 1 decoding operations), the accessing of memory entries is performed when the select signal 503 indicates an odd phase to the MUX 506.

Figure 6:
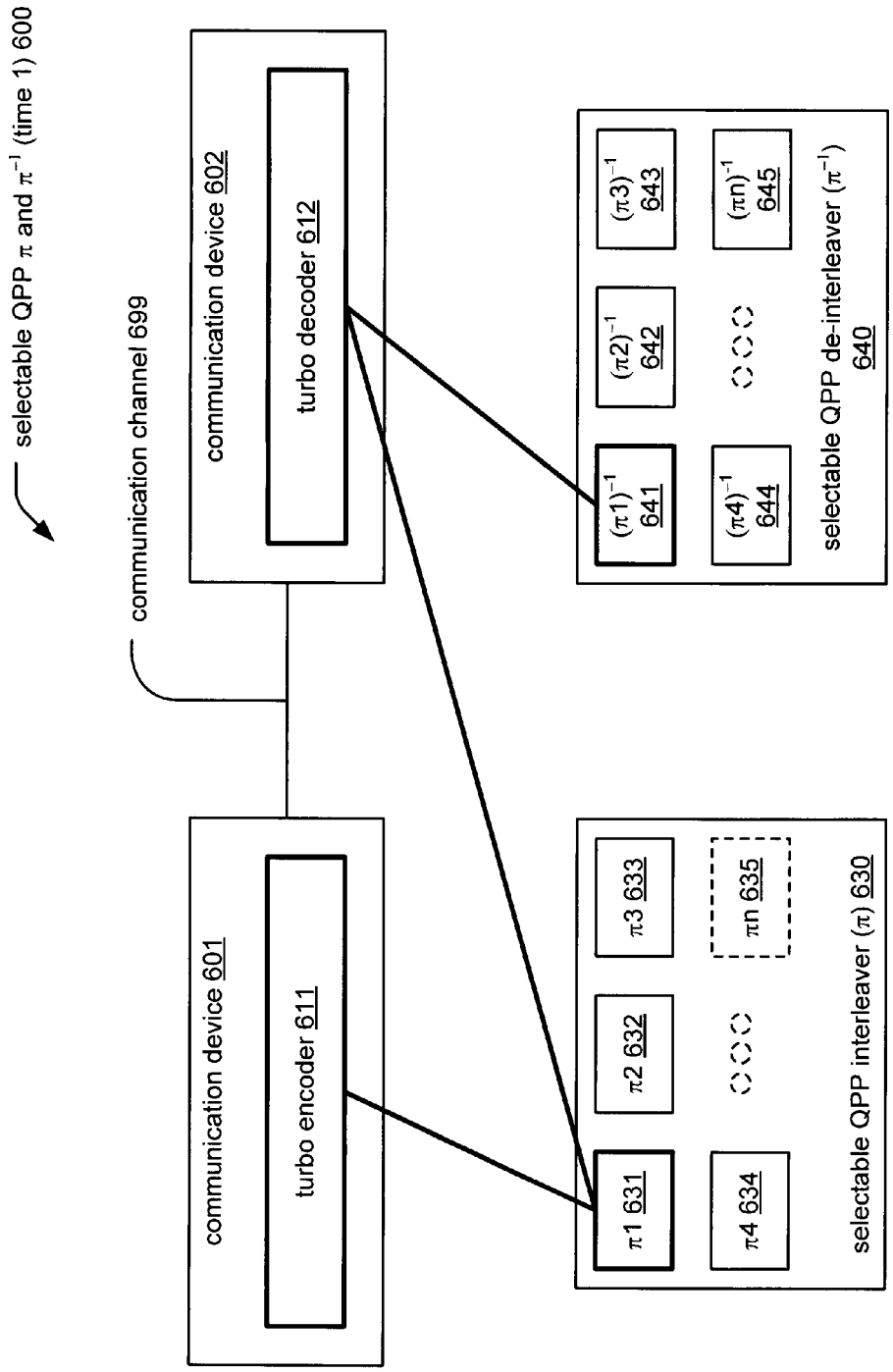
FIG. 6 illustrates an embodiment of a communication system employing selectable QPP interleaving ($\pi$) and de-interleaving ($\pi^{-1}$) at a first time (time 1).

FIG. 6 illustrates an embodiment of a communication system employing selectable QPP interleaving ($\pi$) and de-interleaving ($\pi^{-1}$) at a first time (time 1). As can be seen, a first communication device 601 couples to a second communication device 602 via a communication channel 699.

The first communication device 601 includes a turbo encoder 611 that is operable to employ first selected interleave ($\pi 1$ 631) to encode at least one information bit to generate encoded bits which the first communication device 601 then modulates to generate a turbo coded signal that comports with the communication channel 699, and the first communication device 601 then launches the turbo coded signal into the communication channel 699. After receiving the turbo coded signal from the communication channel 699, the second communication device 602 uses its turbo decoder 612 that is operable to employ the first selected interleave ($\pi 1$ 631) and a first selected de-interleave (($\pi 1$)$^{-1}$ 641) to decode the turbo coded signal to make a best estimate of the at least one information bit encoded therein.

It is noted that each of the first communication device 601 and the second communication device 602 can also be implemented to perform both encoding and decoding.

Each of the turbo encoder 611 and the turbo decoder 612 is operable to select a QPP interleave from a selectable QPP interleaver ($\pi$) 630 that can include any number of interleaves, as shown by the first interleave ($\pi 1$) 631, a second interleave ($\pi 2$) 632, a third interleave ($\pi 3$) 633, a fourth interleave ($\pi 4$) 634, and up to an nth interleave ($\pi n$) 639. Similarly, the turbo decoder 612 is operable to select a QPP de-interleave from a selectable QPP de-interleaver ($\pi^{-1}$) 640 that can include any number of de-interleaves, as shown by the first de-interleave ($\pi 1$)$^{-1}$ 641, a second interleave ($\pi 2$)$^{-1}$ 642, a third interleave ($\pi 3$)$^{-1}$ 643, a fourth interleave ($\pi 4$)$^{-1}$ 644, and up to an nth interleave ($\pi n$)$^{-1}$ 649.

It is noted that which selected QPP interleave is employed by the turbo encoder 611 (e.g., first selected interleave ($\pi 1$ 631)), then the appropriately corresponding de-interleave (e.g., first selected de-interleave ($\pi^{-1}$ 641)) is selected for use in the decoding processing by the turbo decoder 612.

Figure 7:
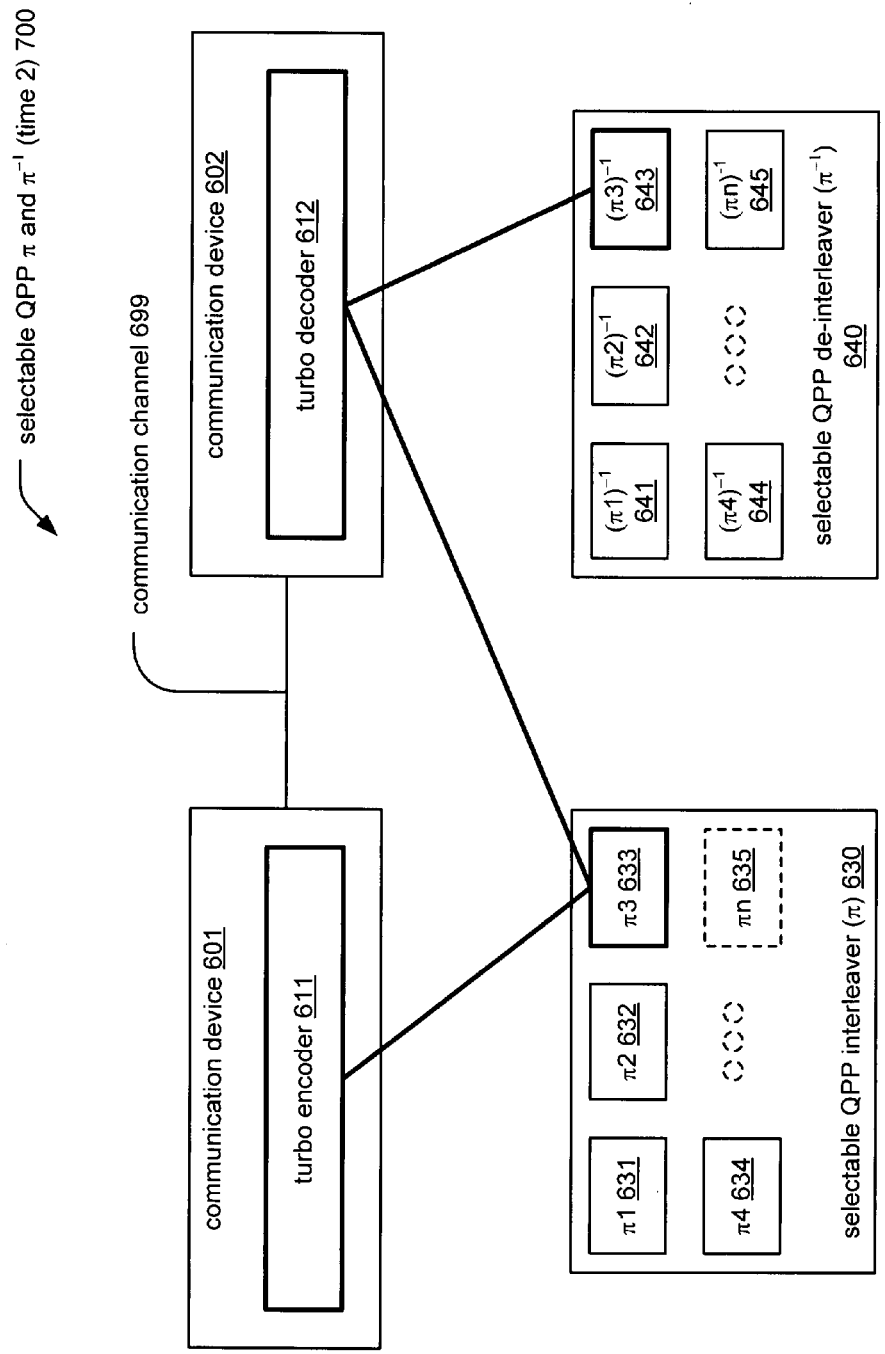
FIG. 7 illustrates an embodiment of a communication system employing selectable QPP interleaving ($\pi$) and de-interleaving ($\pi^{-1}$) at a second time (time 2).

FIG. 7 illustrates an embodiment of a communication system employing selectable QPP interleaving ($\pi$) and de-interleaving ($\pi^{-1}$) at a second time (time 2). This embodiment is analogous to the previous embodiment, with a difference being that the turbo encoder 611 of the first communication device 601 is operable to employ the third selected interleave ($\pi 3$ 633) to encode at least one information bit to generate encoded bits which the first communication device 601 then modulates to generate a turbo coded signal that comports with the communication channel 699, and the first communication device 601 then launches the turbo coded signal into the communication channel 699. After receiving the turbo coded signal from the communication channel 699, the second communication device 602 uses its turbo decoder 612 that is operable to employ the third selected interleave ($\pi 3$ 633) and a third selected de-interleave (($\pi 3$)$^{-1}$ 643) to decode the turbo coded signal to make a best estimate of the at least one information bit encoded therein.

Figure 8:
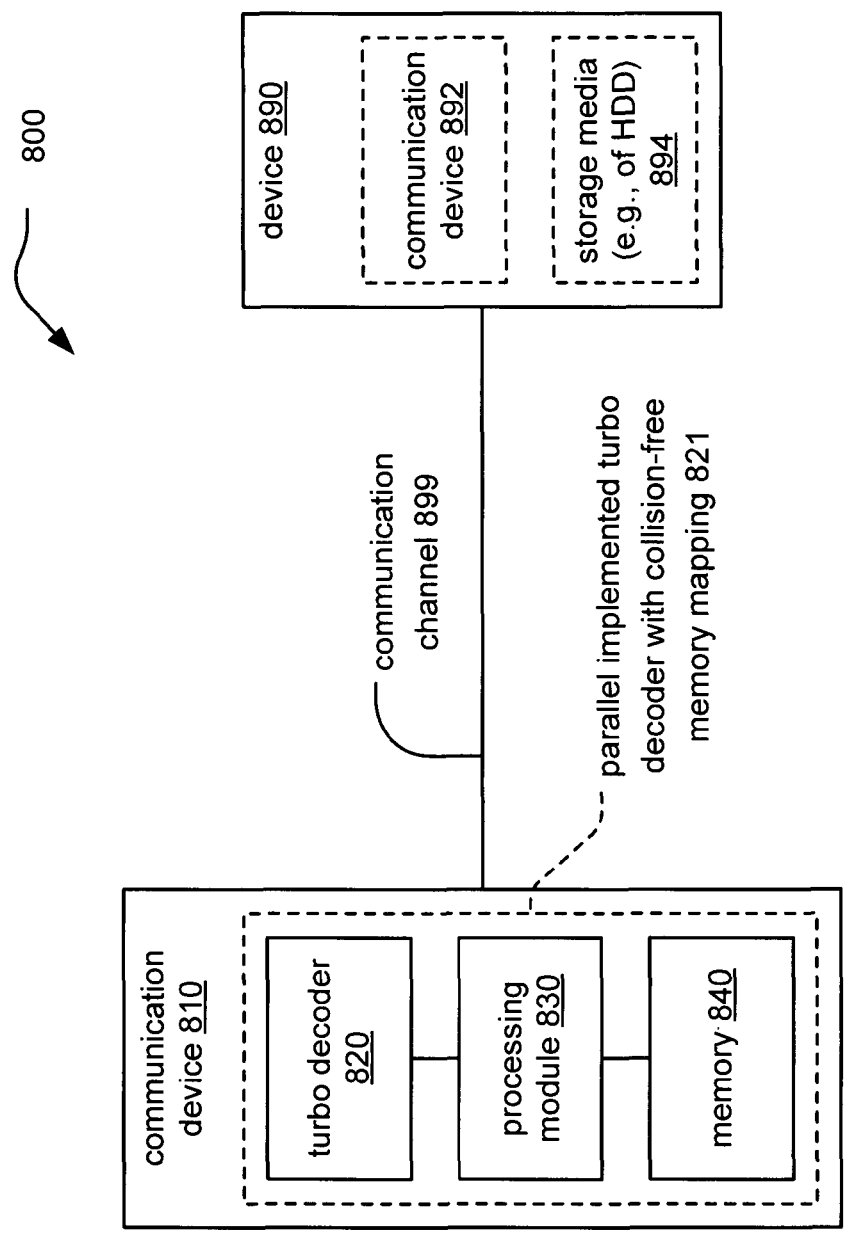
FIG. 8 and FIG. 9 illustrate other embodiments of a communication system.
Figure 9:
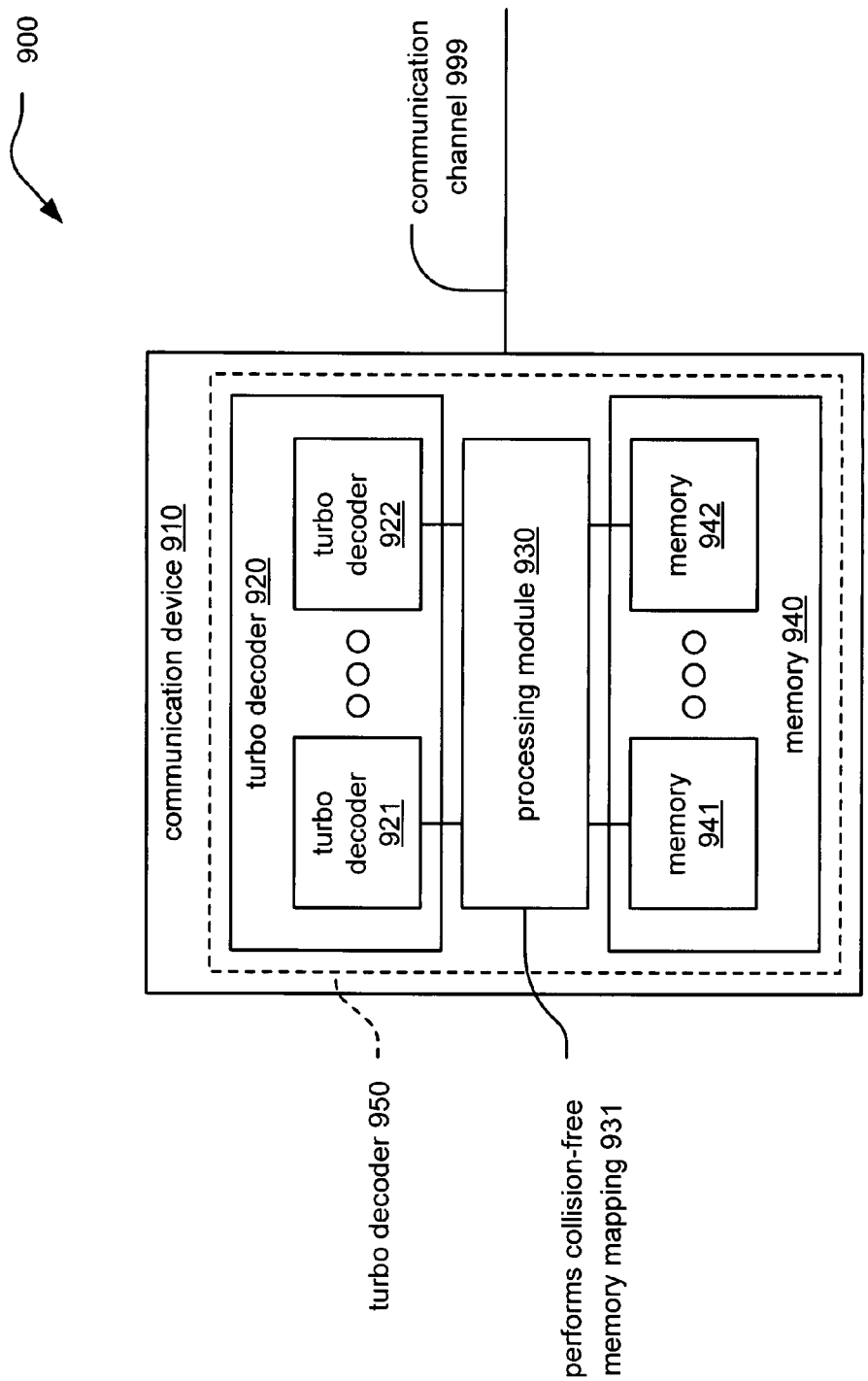

FIG. 8 and FIG. 9 illustrate other embodiments of a communication system.

Referring to the communication system 800 of FIG. 8, the communication system 800 includes a communication device 810 that is coupled to another device 890 via a communication channel 899. The communication device 810 includes a decoder 821 that is implemented as a parallel implemented turbo decoder that is operable to employ collision-free memory mapping.

The other device 890 to which the communication device 810 is coupled via the communication channel 899 can be another communication device 892, a storage media 894 (e.g., such as within the context of a hard disk drive (HDD)), or any other type of device that is capable to receive and/or transmit signals. In some embodiments, the communication channel 899 is a bi-directional communication channel that is operable to perform transmission of a first signal during a first time and receiving of a second signal during a second time. If desired, full duplex communication may also be employed, in which each of the communication device 810 and the device 890 can be transmitted and/or receiving from one another simultaneously.

The decoder 821 of the communication device 810 includes a turbo decoder 820, a processing module 830, and a memory 840. The processing module 830 can be coupled to the memory 840 so that the memory is operable to store operational instructions that enable to the processing module 830 to perform certain functions.

Generally speaking, the processing module 830 is operable to perform collision-free memory mapping between the turbo decoder 820 and the memory 840 during iterative decoding processing.

It is also noted that the processing module 830, as well as any other processing module described herein, can be implemented in any number of ways as described below. In one embodiment, the processing module 830 can be implemented strictly as circuitry. Alternatively, the processing module 830 can be implemented strictly in software such as can be employed within a digital signal processor (DSP) or similar type device. In even another embodiment, the processing module 830 can be implemented as a combination of hardware and software as well without departing from the scope and spirit of the invention.

In even other embodiments, the processing module 830 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 830 can be coupled to the memory 840 that is operable to store operational instructions that enable to processing module 830 to perform the appropriate collision-free memory mapping between the turbo decoder 820 and the memory 840.

Such a memory 840 may be a single memory device or a plurality of memory devices. Such a memory 840 may be a read-only memory, random access memory, volatile memory, non-volatile memory, static memory, dynamic memory, flash memory, and/or any device that stores digital information. Note that when the processing module 830 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Referring to the communication system 900 of FIG. 9, this embodiment is somewhat analogous to the previous embodiment. The communication system 900 includes a communication device 910 that can be coupled to another device via a communication channel 999. The communication device 910 includes a turbo decoder 920 that is itself composed of a plurality of turbo decoders 921-922. The communication device 910 also includes a memory 940 that is itself composed of a plurality of memories 941-942. A processing module 930 is operable to perform collision-free memory mapping between the plurality of turbo decoders 921-922 and the plurality of memories 941-942 during iterative decoding processing of a turbo coded signal.

Figure 10:
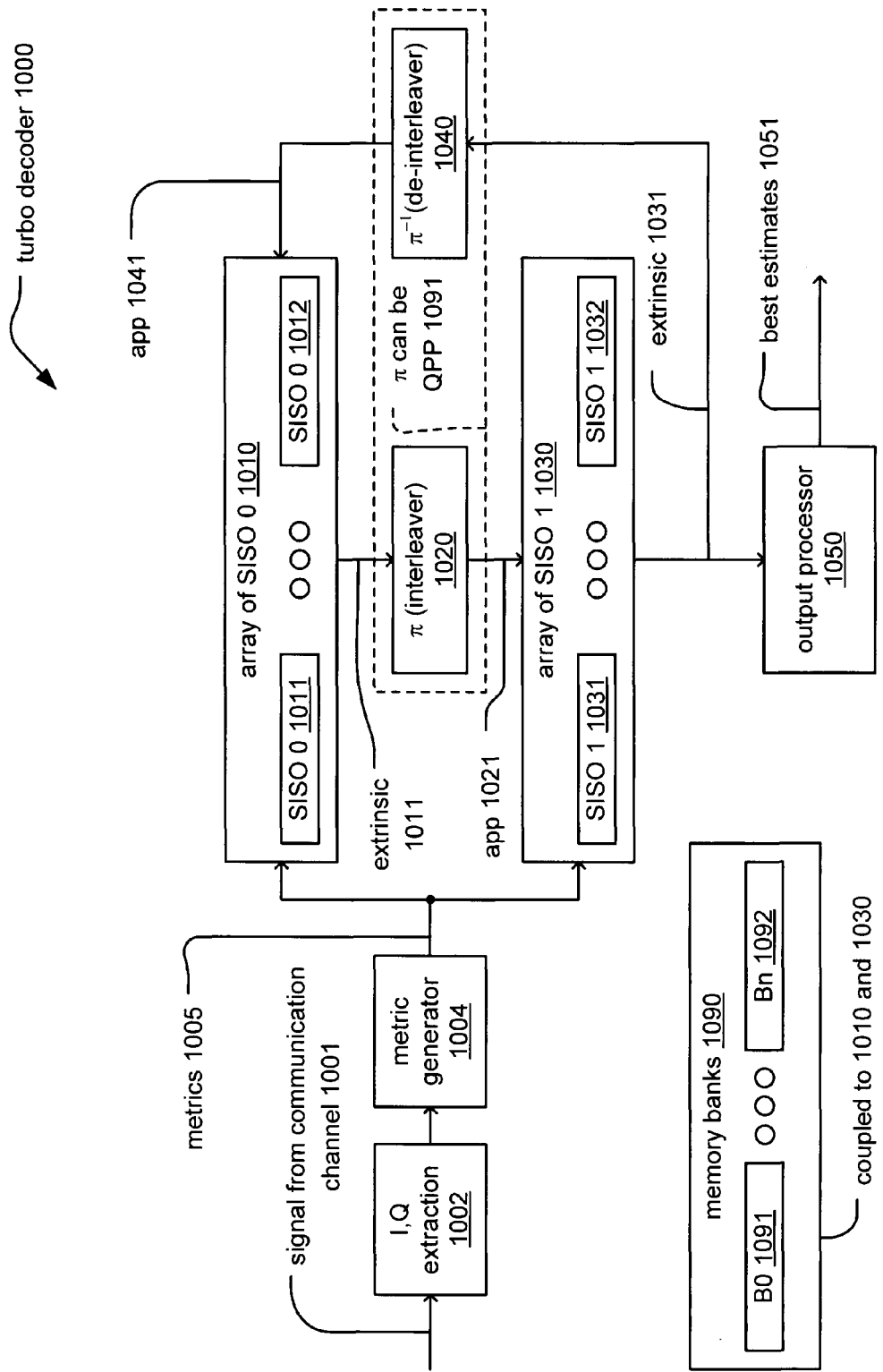
FIG. 10 illustrates an embodiment of a turbo decoder that employs two separate pluralities of SISO decoders for accessing data stored within a plurality of memory banks.

FIG. 10 illustrates an embodiment of a turbo decoder 1000 that employs two separate pluralities of SISO decoders (1010 and 1030) for accessing data stored within a plurality of memory banks 1090. As shown within other embodiments, a received signal (e.g., typically received from a communication channel) is provided to an I,Q extraction module 1002 that extracts the I,Q (in-phase and quadrature) components from the received signal 1001. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 1004. The metric generator 1004 generates the appropriate metrics 1041 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 1041 that are calculated by the metric generator 1004 are then provided simultaneously provided for use by a first array of soft-in/soft-out (SISO) 0 decoders 1010 and a first array of SISO 1 decoders 1030. This first array of SISO 0 decoders 1010 includes a number of SISO 0 decoders, as shown by as shown by SISO 0 1011, . . . , and SISO 0 1012. Each individual SISO decoder in the array of SISO 0 decoders 1010 is operable to perform SISO decoding of data stored within a particular memory location within one of the particular memory banks 1090.

The earlier calculated metrics 1041 that are calculated by the metric generator 1004 are also provided to the second array of SISO 1 decoders 1030. This array of SISO 1 decoders 1030 includes a number of SISO 1 decoders, as shown by as shown by SISO 1 1031, . . . , and SISO 1 1032. Each individual SISO decoder in the array of SISO 1 decoders 1030 is also operable to perform SISO decoding of data stored within a particular memory location within one of the particular memory banks 1090.

In the context of trellis coding (e.g., turbo trellis coded modulation (TTCM)), each of the first array of SISO 0 decoder 1010 and the second array of SISO 1 decoders 1030 calculates forward metrics (alphas) and backward metrics (betas), and extrinsic values according to the trellis employed for each of the individual data entries within each of the corresponding memory locations that are being updated in that particular decoding iterations.

These alphas, betas, and extrinsics are all calculated for each symbol within a frame that is to be decoded. These calculations of alphas, betas, and extrinsics are all based on the trellis.

Starting with the first array of SISO 0 decoders 1010, after the extrinsic values 1011 have been calculated, they are passed to an interleaver ($\pi$) 1020 after which it is passed to the second array of SISO 1 decoders 1030 as "a priori probability" (app) information 1021. It is noted that the accessing of the data within the memory banks 1090 is performed in a collision-free manner because of an appropriately selected memory mapping employed therein which is operable in conjunction with a selected particular quadratic polynomial permutation (QPP) interleave ($\pi$) that satisfies a parallel turbo decoding implementation with any desired number of parallel implemented turbo decoding processors as described herein.

Similarly, after extrinsic values 1031 have been calculated within the second array SISO 1 decoders 1030, they are passed to a de-interleaver ($\pi^{-1}$) 1040 after which it is passed as "a priori probability" (app) information 1041 back to the first array SISO 0 decoders 1010.

It is noted that a single decoding iteration, within the iterative decoding process of the turbo decoder 1000 consists of performing two SISO operations; that is to say, the iterative decoding process must pass through both the first array of SISO 0 decoders 1010 and through the second array of SISO 1 decoders 1030.

After a significant level of confidence has been achieved and a solution is being converged upon, or after a predetermined number of decoding iterations has been performed, then the output from the second array of SISO 1 decoders 1030 is passed as output to an output processor 1050. The operation of the array of SISO 0 decoders 1010 and the array of SISO 1 decoders 1030 may generally be referred to as calculating soft symbol decisions of the symbols contained within the received signal 1001. These soft symbol decisions may be performed on a true bit level in certain embodiments. The output processor 1050 uses these soft symbol decisions to generate best estimates 1051 (e.g., hard bit and/or symbol decisions) for the information bits that have been encoded within the original turbo coded signal (e.g., generally within a turbo encoder location at another end of a communication channel into which the signal 1001 was originally launched.

It is also noted that each of the interleaving performed within the interleaver (π) 1020 can be performed using an embodiment of a QPP interleave, as shown by reference numeral 1091. Also, there are embodiments in which the de-interleaving performed within the de-interleaver ($\pi^{-1}$) 1040 can also be performed using an embodiment of a QPP de-interleave.

Figure 11:
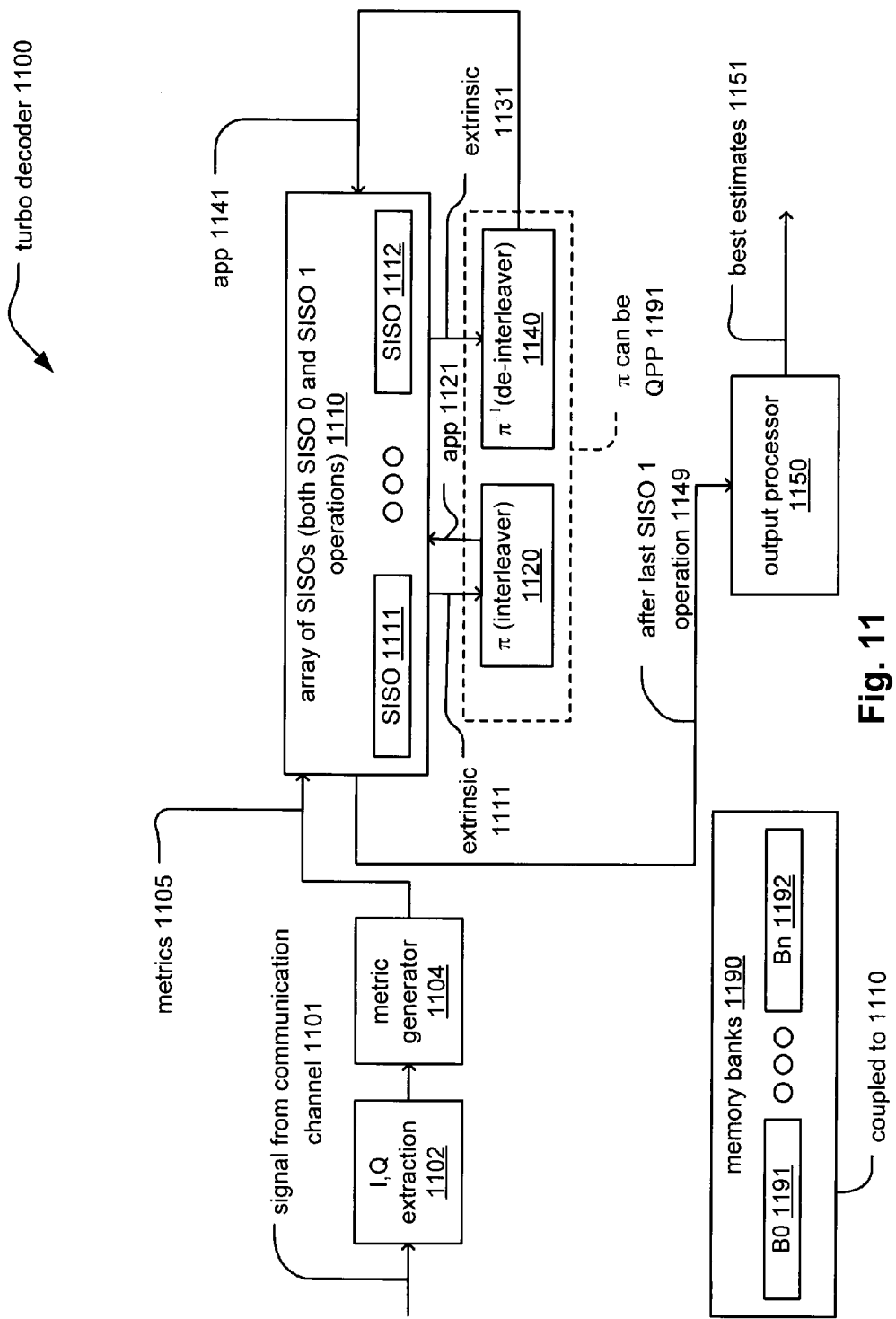
FIG. 11 illustrates an embodiment of a turbo decoder that employs a plurality of SISO decoders for accessing data stored within a plurality of memory banks.

FIG. 11 illustrates an embodiment of a turbo decoder 1100 that employs a plurality of SISO decoders for accessing data stored within a plurality of memory banks. As shown within other embodiments, a received signal (e.g., typically received from a communication channel) is provided to an I,Q extraction module 1102 that extracts the I,Q (in-phase and quadrature) components from the received signal 1101. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 1104. The metric generator 1104 generates the appropriate metrics 1141 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 1141 that are calculated by the metric generator 1104 are then provided for use by an array of soft-in/soft-out (SISO) decoders 1110 that is operable to perform both the SISO 0 and the SISO 1 decoding operations. This array of SISO decoders 1110 includes a number of SISO decoders, as shown by as shown by SISO 1111, . . . , and SISO 1112. Each individual SISO decoder in the array of SISO decoders 1110 is operable to perform SISO decoding of data stored within a particular memory location within one of the particular memory banks 1190 (for both the SISO 0 and SISO 1 decoding operations).

In the context of trellis coding (e.g., turbo trellis coded modulation (TTCM)), each SISO decoder of the array of SISO decoder 1110 calculates forward metrics (alphas) and backward metrics (betas), and extrinsic values according to the trellis employed for each of the individual data entries within each of the corresponding memory locations that are being updated in that particular decoding iterations.

These alphas, betas, and extrinsics are all calculated for each symbol within a frame that is to be decoded. These calculations of alphas, betas, and extrinsics are all based on the trellis.

Starting with the first decoding operation (i.e., SISO 0) as performed by the array of SISO decoders 1110, after the extrinsic values 1111 have been calculated, they are passed to an interleaver (π) 1120 after which it is passed to back to the array of SISO decoders 1110 as "a priori probability" (app) information 1121.

It is noted that the accessing of the data within the memory banks 1190 by the array of SISO decoders 1110, when performing the SISO 1 decoding operations, is performed in a collision-free manner because of an appropriately selected memory mapping employed therein which is operable in conjunction with a selected particular quadratic polynomial permutation (QPP) interleave (π) that satisfies a parallel turbo decoding implementation with any desired number of parallel implemented turbo decoding processors as described herein.

Similarly, after extrinsic values 1131 have been calculated within the SISO decoders 1110 (i.e., during the SISO 1 decoding operations), they are passed to a de-interleaver ($\pi^{-1}$) 1140 after which it is passed as "a priori probability" (app) information 1141 back to the SISO decoders 1110.

It is noted that a single decoding iteration, within the iterative decoding process of the turbo decoder 1100 consists of performing two SISO operations; that is to say, the iterative decoding process must pass through the array of SISO decoders 1110 twice.

After a significant level of confidence has been achieved and a solution is being converged upon, or after a predetermined number of decoding iterations have been performed, then the output from the array of SISO decoders 1110 (after having performed the SISO 1 decoding operations) is passed as output to an output processor 1150. The operation of the array of SISO decoders 1110 may generally be referred to as calculating soft symbol decisions of the symbol contained within the received symbol. These soft symbol decisions may be performed on a true bit level in certain embodiments. The output processor 1150 uses these soft symbol decisions to generate best estimates 1151 (e.g., hard bit and/or symbol decisions) for the information bits that have been encoded within the original turbo coded signal (e.g., generally within a turbo encoder location at another end of a communication channel into which the signal 1101 was originally launched.

It is also noted that each of the interleaving performed within the interleaver (π) 1120 can be performed using an embodiment of a QPP interleave, as shown by reference numeral 1191. Also, there are embodiments in which the de-interleaving performed within the de-interleaver ($\pi^{-1}$) 1140 can also be performed using an embodiment of a QPP de-interleave.

As shown within this embodiment, a single array of SISO decoders 1110 is operable to perform both the SISO 0 and the SISO 1 decoding operations. Also, it is noted that a single module can be employed to perform both the functionality of the interleaver (π) 1120 and the de-interleaver ($\pi^{-1}$) 1140, and both of these can be based on a QPP format.

Figure 12:
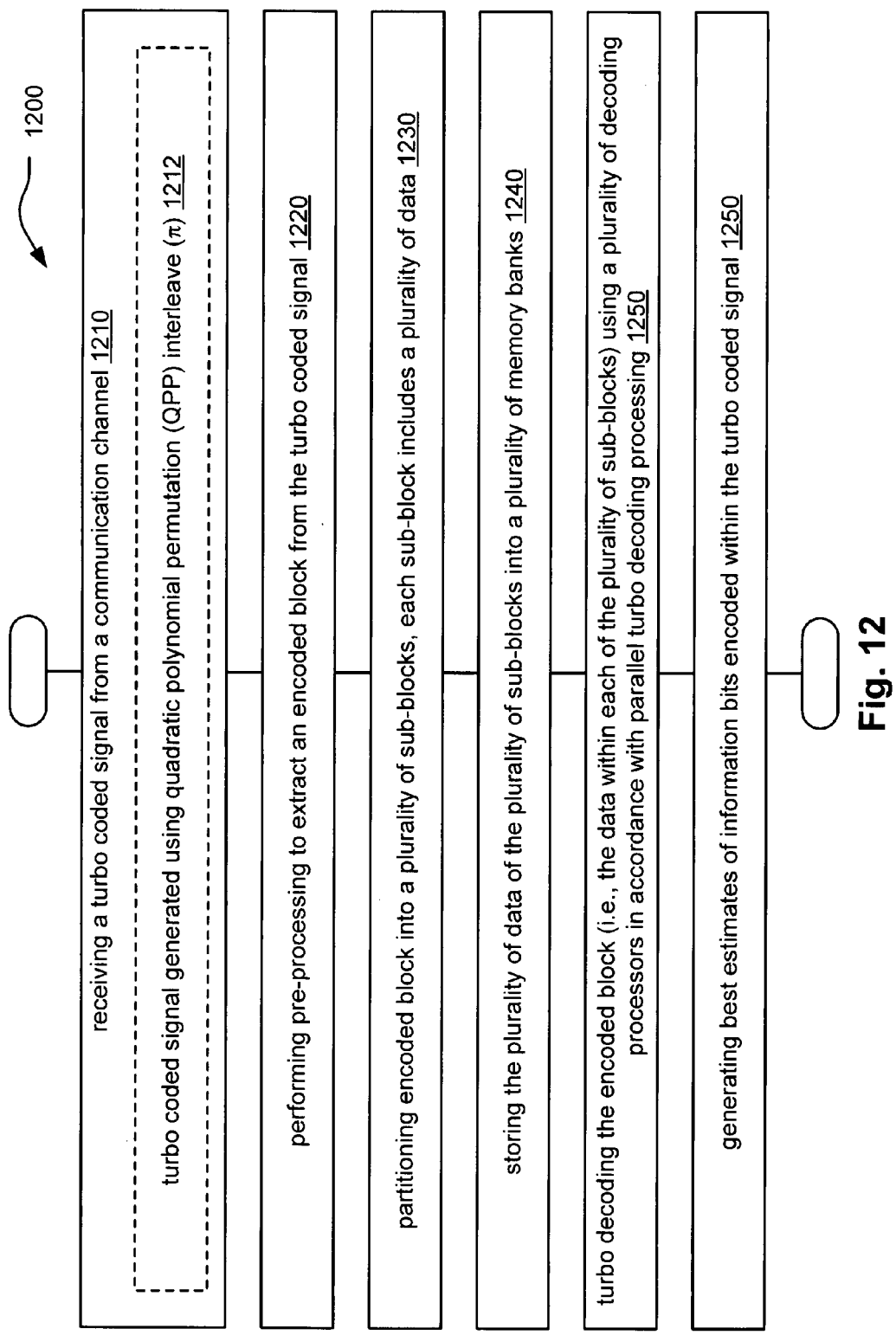
FIG. 12 illustrates an embodiment of a method for decoding a turbo coded signal.

FIG. 12 illustrates an embodiment of a method 1200 for decoding a turbo coded signal. As shown in a block 1210, the method 1200 begins by receiving a turbo coded signal from a communication channel. It is noted that the turbo coded signal can be generated using a quadratic polynomial permutation (QPP) interleave (π1), as depicted in a block 1212.

The method 1200 continues by performing pre-processing to extract an encoded block from the turbo coded signal, as shown in a block 1220. The method 1200 continues by partitioning the encoded block into a plurality of sub-blocks, as shown in a block 1230. It is also noted that each sub-block itself includes a plurality of data.

The method 1200 then continues by storing the plurality of data of the plurality of sub-blocks into a plurality of memory banks, as shown in a block 1230. The method 1200 also continues by turbo decoding the encoded block (i.e., the data within each of the plurality of sub-blocks) using a plurality of decoding processors in accordance with parallel turbo decoding processing, as shown in a block 1250. The method 1200 also continues by generating best estimates of information bits encoded within the turbo coded signal, as shown in a block 1260.

Figure 13:
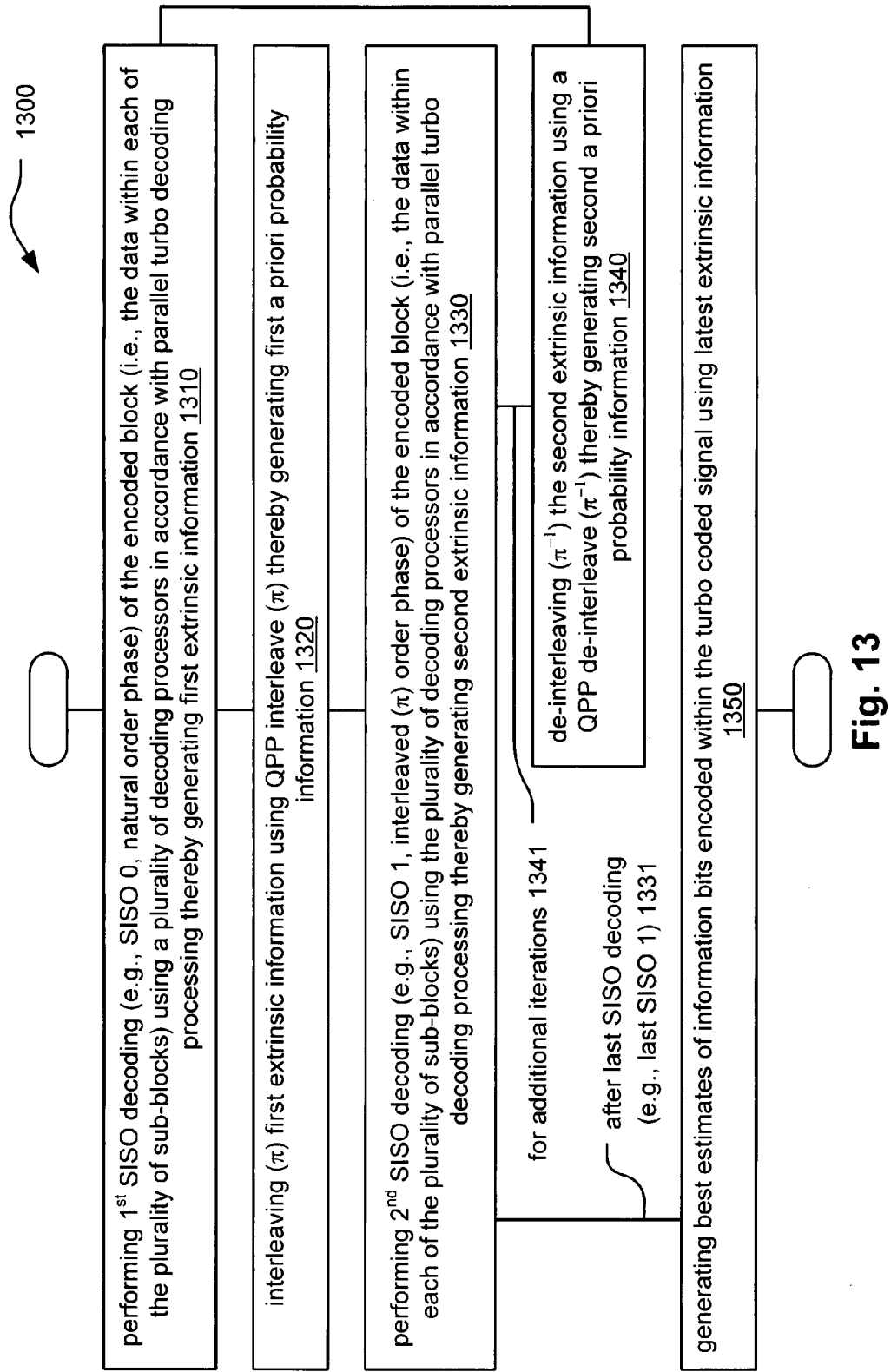
FIG. 13 illustrates an alternative embodiment of a method for decoding a turbo coded signal.

FIG. 13 illustrates an alternative embodiment of a method 1300 for decoding a turbo coded signal. Initially, in certain embodiments, the method 1300 can preliminarily perform analogous operations as described within blocks 1210, 1220, 1230, and 1240 of method 1200 of FIG. 12.

As shown in a block 1310, the method 1300 operates by performing $1^{st}$ SISO decoding (e.g., SISO 0, natural order phase) of the encoded block (i.e., the data within each of the plurality of sub-blocks) using a plurality of decoding processors in accordance with parallel turbo decoding processing thereby generating first extrinsic information, as shown in a block 1310. A plurality of data of a plurality of sub-blocks stored in and accessed from a plurality of memory banks.

The method 1300 then continues by interleaving ($\pi$) first extrinsic information using a quadratic polynomial permutation (QPP) interleave ($\pi$) thereby generating first a priori probability information, as shown in a block 1320.

The method 1300 then continues by performing $2^{nd}$ SISO decoding (e.g., SISO 1, interleaved ($\pi$) order phase) of the encoded block (i.e., the data within each of the plurality of sub-blocks) using the plurality of decoding processors in accordance with parallel turbo decoding processing thereby generating second extrinsic information, as shown in a block 1330.

When performing additional decoding operations as shown by reference numeral 1351, the method 1300 continues by de-interleaving ($\pi^{-1}$) the second extrinsic information using a quadratic polynomial permutation (QPP) de-interleave ($\pi^{-1}$) thereby generating second a priori probability information, as shown in a block 1340. The method 1300 then continues by returning to block 1310 for subsequent decoding iterations.

However, when a final decoding iteration has been performed (e.g., all of the SISO 0 and SISO 1 decoding operations have been performed, and particularly after a final SISO 1 decoding operation has been performed) as shown by reference numeral 1331, then the method 1300 continues by generating best estimates of information bits encoded within the turbo coded signal, as shown in a block 1350.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.
[2] O. Y. Takeshita, "On maximum contention-free interleavers and permutation polynomials over integer rings," IEEE Trans. Information Theory, vol 52, No. 3, March 2006.
[3] Ericsson, Motorola, QPP interleaver parameters, 3GPP TSG RAN WG1 #47 bis R1-070484.
[4] A. Tarable, S. Benedetto and G. Montorsi "Mapping Interleaving Laws to Parallel Turbo and LDPC Decoder Architectures," *IEEE Trans. on Information Theory*, Vol. 50, No. 9, pp. 2002-2009, September 2004.

What is claimed is:

1. A turbo encoder having selectable interleaving, the turbo encoder comprising:
a first constituent encoder that is operable to encode an information block thereby generating a first encoded plurality of bits;
a selectable interleaver module that is operable to:
employ one selected quadratic polynomial permutation (QPP) interleave of a plurality of QPP interleaves to interleave the information block;
interleave any sized turbo code block within a predetermined turbo code block size range that is divided into k sub-ranges, where k is an integer; and
employ a plurality of coefficients to effectuate each QPP interleave of the plurality of QPP interleaves, the plurality of coefficients including k+1 coefficients; and
a second constituent encoder that is operable to encode the interleaved information block thereby generating a second encoded plurality of bits; and wherein:
bits alternatively selected from the first encoded plurality of bits and the second encoded plurality of bits forming an encoded block; and
the alternatively selected bits undergoing modulation to generate a turbo coded signal that comports with a communication channel.

2. The turbo encoder of claim 1, further comprising:
a dummy bit module that is selectively operable to modify the information block by adding a dummy bit to the information block based on the size of the information block.

3. The turbo encoder of claim 1, wherein:
the turbo encoder is implemented in a first communication device;
the first communication device is a coupled to a second communication device via the communication channel;
the second communication device is operable to receive the turbo coded signal from the communication channel; and
the second communication device includes a plurality of turbo decoders implemented to perform parallel decoding processing of the turbo coded signal.

4. The turbo encoder of claim 1, wherein:
the turbo encoder is coupled to a turbo decoder via the communication channel;

the turbo decoder is operable to receive the turbo coded signal from the communication channel;

the turbo decoder is operable to perform selectable interleaving and de-interleaving when decoding turbo coded signal, the turbo decoder includes:

a first soft-in/soft-out (SISO) decoder that is operable to perform SISO decoding on a plurality of metrics associated with the turbo coded signal thereby calculating first extrinsic information;

at least one additional selectable interleaver module that is operable to employ one selected QPP interleave to perform interleaving on the first extrinsic information thereby generating first "a priori probability" (app) information;

a second SISO decoder that is operable to perform SISO decoding on the first app information thereby generating second extrinsic information;

a selectable de-interleaver module that is operable to employ one selected QPP de-interleave to perform de-interleaving on the second extrinsic information thereby generating second app information; and an output processor that is operable to process most recent extrinsic information that has been generated by the second SISO decoder thereby generating a best estimate of at least one information bit encoded within the turbo coded signal.

5. The turbo encoder of claim 1, wherein:
the turbo encoder is implemented in a first communication device;
the first communication device is a coupled to a second communication device via the communication channel;
the second communication device is operable to receive the turbo coded signal from the communication channel;
the second communication device includes a turbo decoder that is operable to perform decoding processing of the turbo coded signal thereby generating a best estimate of at least one information bit encoded within the turbo coded signal; and
the turbo decoder is operable to employ the one selected QPP interleave and a QPP de-interleave that corresponds to the one selected quadratic polynomial permutation (QPP) interleave when performing decoding processing of the turbo coded signal.

6. The turbo encoder of claim 1, wherein:
one coefficient within the plurality of coefficients is a prime number.

7. The turbo encoder of claim 1, wherein:
the selectable interleaver module is operable to generate the one selected QPP interleave of the plurality of QPP interleaves in real time using a closed formula that employs the k+1 coefficients.

8. The turbo encoder of claim 1, wherein:
the turbo encoder is implemented within a wireless personal communication device.

9. The turbo encoder of claim 1, wherein:
the turbo encoder is implemented within a communication device; and
the communication device is implemented within a wireless communication system.

10. The turbo encoder of claim 1, wherein:
the turbo encoder is implemented within a communication device; and
the communication device is implemented within at least one of a satellite communication system, a wireless communication system, a wired communication system, and a fiber-optic communication system.

11. A turbo encoder having selectable interleaving, the turbo encoder comprising:
a dummy bit module that is selectively operable to modify an information block by adding a dummy bit to the information block based on the size of the information block thereby generating a modified information block;
a first constituent encoder that is operable to encode the modified information block thereby generating a first encoded plurality of bits;
a selectable interleaver module that is operable to:
employ one selected quadratic polynomial permutation (QPP) interleave of a plurality of QPP interleaves to interleave the modified information block;
interleave any sized turbo code block or modified information block within a predetermined turbo code block size range that is divided into k sub-ranges, where k is an integer; and
employ a plurality of coefficients to effectuate each QPP interleave of the plurality of QPP interleaves, the plurality of coefficients including k+1 coefficients; and
a second constituent encoder that is operable to encode the interleaved information block or modified interleaved information block thereby generating a second encoded plurality of bits; and wherein:
bits alternatively selected from the first encoded plurality of bits and the second encoded plurality of bits forming an encoded block;
the alternatively selected bits undergo modulation to generate a turbo coded signal that comports with a communication channel; and
the selectable interleaver module is operable to generate the one selected QPP interleave of the plurality of QPP interleaves in real time using a closed formula that employs the k+1 coefficients.

12. The turbo encoder of claim 11, wherein:
the turbo encoder is implemented in a first communication device;
the first communication device is a coupled to a second communication device via the communication channel;
the second communication device is operable to receive the turbo coded signal from the communication channel; and
the second communication device includes a plurality of turbo decoders implemented to perform parallel decoding processing of the turbo coded signal.

13. The turbo encoder of claim 11, wherein:
the turbo encoder is coupled to a turbo decoder via the communication channel;
the turbo decoder is operable to receive the turbo coded signal from the communication channel;
the turbo decoder is operable to perform selectable interleaving and de-interleaving when decoding turbo coded signal, the turbo decoder includes:
a first soft-in/soft-out (SISO) decoder that is operable to perform SISO decoding on a plurality of metrics associated with the turbo coded signal thereby calculating first extrinsic information;
at least one additional selectable interleaver module that is operable to employ one selected QPP interleave to perform interleaving on the first extrinsic information thereby generating first "a priori probability" (app) information;
a second SISO decoder that is operable to perform SISO decoding on the first app information thereby generating second extrinsic information;
a selectable de-interleaver module that is operable to employ one selected QPP de-interleave to perform de-interleaving on the second extrinsic information thereby generating second app information; and an output processor that is operable to process most recent extrinsic information that has been generated by the second SISO decoder thereby generating a best estimate of at least one information bit encoded within the turbo coded signal.

14. The turbo encoder of claim 11, wherein:

the turbo encoder is implemented in a first communication device;

the first communication device is a coupled to a second communication device via the communication channel;

the second communication device is operable to receive the turbo coded signal from the communication channel;

the second communication device includes a turbo decoder that is operable to perform decoding processing of the turbo coded signal thereby generating a best estimate of at least one information bit encoded within the turbo coded signal; and the turbo decoder is operable to employ the one selected QPP interleave and a QPP de-interleave that corresponds to the one selected quadratic polynomial permutation (QPP) interleave when performing decoding processing of the turbo coded signal.

15. The turbo encoder of claim 11, wherein:

the turbo encoder is implemented within a communication device; and the communication device is implemented within a wireless communication system.

16. The turbo encoder of claim 11, wherein:

the turbo encoder is implemented within a communication device; and the communication device is implemented within at least one of a satellite communication system, a wireless communication system, a wired communication system, and a fiber-optic communication system.

17. A method for turbo encoding at least one information bit using selectable quadratic polynomial permutation (QPP) interleaving, the method comprising:

selectively modifying an information block by adding a dummy bit to the information block based on the size of the information block thereby generating a modified information block, wherein the information block being within a predetermined block size range that is divided into k sub-ranges, where k is an integer;

employing a first constituent encoder to encode the information block or the modified information block thereby generating a first encoded plurality of bits;

employing one selected QPP interleave of a plurality of QPP interleaves to interleave the information block or the modified information block;

employing a plurality of coefficients to effectuate each QPP interleave of the plurality of QPP interleaves, the plurality of coefficients including k+1 coefficients;

employing a second constituent encoder to encode the interleaved information block or the or the interleaved modified information block thereby generating a second encoded plurality of bits;

alternatively selecting bits from the first encoded plurality of bits and the second encoded plurality of bits to form an encoded block;

modulating the encoded block to generate a turbo coded signal that comports with a communication channel; and launching the turbo coded signal into the communication channel.

18. The method of claim 17, further comprising:

generating the one selected QPP interleave of the plurality of QPP interleaves in real time using a closed formula that employs the k+1 coefficients.

19. The method of claim 17, wherein:

the method is performed within a turbo encoder;

the turbo encoder is implemented within a communication device; and the communication device is implemented within a wireless communication system.

20. The method of claim 17, wherein:

the method is performed within a turbo encoder;

the turbo encoder is implemented within a communication device; and the communication device is implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

| | |
|---|---|
| PATENT NO. | : 7,975,203 B2 |
| APPLICATION NO. | : 11/810890 |
| DATED | : July 5, 2011 |
| INVENTOR(S) | : Ba-Zhong Shen et al. |

It is certified that error appears in the above-identified patent and that said Letters Patent is hereby corrected as shown below:

Col. 16, line 57, in claim 3: after "communication device is" delete "a"
Col. 18, line 38, in claim 12: after "communication device is" delete "a"
Col. 20, line 14, in claim 17: after "or the" delete "or the"

Signed and Sealed this
Fourth Day of December, 2012

David J. Kappos
*Director of the United States Patent and Trademark Office*